United States Patent
Hsu et al.

(10) Patent No.: US 9,385,206 B2
(45) Date of Patent: *Jul. 5, 2016

(54) SEMICONDUCTOR DEVICE HAVING SPACER WITH TAPERED PROFILE

(71) Applicant: UNITED MICROELECTRONICS CORP., Hsin-Chu (TW)

(72) Inventors: Chia-Fu Hsu, Tainan (TW); Chun-Mao Chiou, Chiayi County (TW); Shih-Chieh Hsu, New Taipei (TW); Jian-Cun Ke, Tainan (TW); Chun-Lung Chen, Tainan (TW); Lung-En Kuo, Tainan (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/919,738

(22) Filed: Oct. 22, 2015

(65) Prior Publication Data

US 2016/0043195 A1 Feb. 11, 2016

Related U.S. Application Data

(63) Continuation of application No. 14/328,720, filed on Jul. 11, 2014, now Pat. No. 9,196,699.

(30) Foreign Application Priority Data

Jun. 18, 2014 (TW) .............................. 103121078 A

(51) Int. Cl.
| | | |
|---|---|---|
| *H01L 29/76* | (2006.01) | |
| *H01L 29/49* | (2006.01) | |
| *H01L 29/51* | (2006.01) | |
| *H01L 21/28* | (2006.01) | |
| *H01L 29/66* | (2006.01) | |
| *H01L 29/78* | (2006.01) | |

(52) U.S. Cl.
CPC ........ *H01L 29/495* (2013.01); *H01L 21/28088* (2013.01); *H01L 29/4983* (2013.01); *H01L 29/513* (2013.01); *H01L 29/517* (2013.01); *H01L 29/6656* (2013.01); *H01L 29/78* (2013.01); *H01L 29/66545* (2013.01)

(58) Field of Classification Search
CPC . H01L 29/6653; H01L 29/495; H01L 29/517; H01L 29/78; H01L 21/823468; H01L 21/823864
USPC ........................... 438/303, 305, 595; 257/336
See application file for complete search history.

(56) References Cited

U.S. PATENT DOCUMENTS

| | | | |
|---|---|---|---|
| 5,789,298 A | 8/1998 | Gardner | |
| 5,904,528 A | 5/1999 | Lin | |
| 6,228,762 B1 | 5/2001 | Park | |
| 6,255,180 B1* | 7/2001 | Smith | ............... H01L 21/266 257/E21.346 |
| 8,193,586 B2 | 6/2012 | Chen et al. | |
| 8,236,678 B2 | 8/2012 | Yelehanka | |
| 9,196,726 B2* | 11/2015 | Ke | ..................... H01L 29/7833 |
| 2005/0280104 A1 | 12/2005 | Li | |
| 2010/0270598 A1* | 10/2010 | Kao | ..................... H01L 29/78 257/288 |
| 2012/0132998 A1* | 5/2012 | Kwon | ............... H01L 21/28088 257/369 |
| 2013/0320449 A1 | 12/2013 | Hoentschel et al. | |

* cited by examiner

*Primary Examiner* — Kevin M Picardat
(74) *Attorney, Agent, or Firm* — Winston Hsu; Scott Margo

(57) ABSTRACT

A semiconductor device is disclosed. The semiconductor device includes a substrate, a gate structure on the substrate, and a spacer adjacent to the gate structure, in which the bottom of the spacer includes a tapered profile and the tapered profile comprises a convex curve.

11 Claims, 3 Drawing Sheets

SEMICONDUCTOR DEVICE HAVING SPACER WITH TAPERED PROFILE

CROSS REFERENCE TO RELATED APPLICATIONS

This is a continuation application of U.S. patent application Ser. No. 14/328,720, filed on Jul. 11, 2014, and all benefits of such earlier application are hereby claimed for this new continuation application.

BACKGROUND OF THE INVENTION

1. Field of the Invention

The invention relates to a semiconductor device, and more particularly to a semiconductor device having spacer with tapered profile.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the stage when spacer is formed on the sidewall of gate structure, issues such as over-etching or undercut often arise and causing etching gas to etch through spacer until reaching the bottom of the gate structure. This induces erosion in high-k dielectric layer and/or bottom barrier metal (BBM) and affects the performance of the device substantially. Hence, how to resolve this issue has become an important task in this field.

SUMMARY OF THE INVENTION

According to a preferred embodiment of the present invention, a method for fabricating semiconductor device includes the steps of: providing a substrate; forming a gate structure on the substrate; depositing a liner on the gate structure and the substrate; and performing an etching process by injecting a gas comprising $CH_3F$, $O_2$, and He for forming a spacer adjacent to the gate structure.

According to another aspect of the present invention, a semiconductor device includes: a substrate; a gate structure on the substrate; and a spacer adjacent to the gate structure, wherein the bottom of the spacer comprises a tapered profile.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
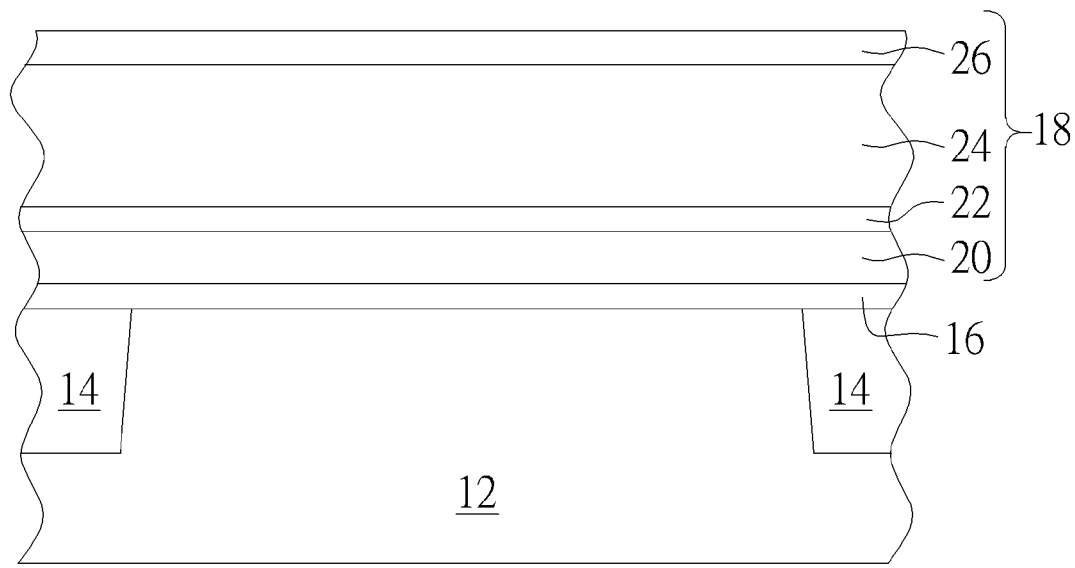
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12, such as a wafer or silicon-on-insulator (SOI) substrate is provided, in which a plurality of shallow trench isolations (STIs) 14 are formed in the substrate 12. An interfacial layer 16 is then deposited on the substrate 12 and the STI 14, and a stack structure 18 is formed on the substrate 12 thereafter. The formation of the stack structure 18 is accomplished by sequentially forming a high-k dielectric layer 20, a bottom barrier metal (BBM) layer 22, a silicon layer 24, and a hard mask 26 on the interfacial layer 16

In this embodiment, the interfacial layer 16 is preferably composed of silicon material such as silicon dioxide ($SiO_2$), silicon nitride (SiN), or silicon oxynitride (SiON), or other dielectric material with high permittivity or dielectric constant. The silicon layer 24 is preferably composed of single crystal silicon, doped polysilicon, or amorphous polysilicon, and the hard mask 16 could be selected from the group consisting of SiC, SiON, SiN, SiCN and SiBN, but not limited thereto. Despite the hard mask 26 in this embodiment is preferably a single-layered hard mask, a composite hard mask composed of both silicon nitride layer and silicon oxide layer could also be utilized according to the demand of the process, which is also within the scope of the present invention.

As the present embodiment pertains to a high-k first process from gate last process, the high-k dielectric layer 20 preferably has a "I-shaped" cross section and preferably be selected from dielectric materials having dielectric constant (k value) larger than 4. For instance, the high-k dielectric layer 20 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the high-k dielectric layer 20 may be formed by atomic layer deposition (ALD) process or metal-organic chemical vapor deposition (MOCVD) process, but not limited thereto.

Figure 2:
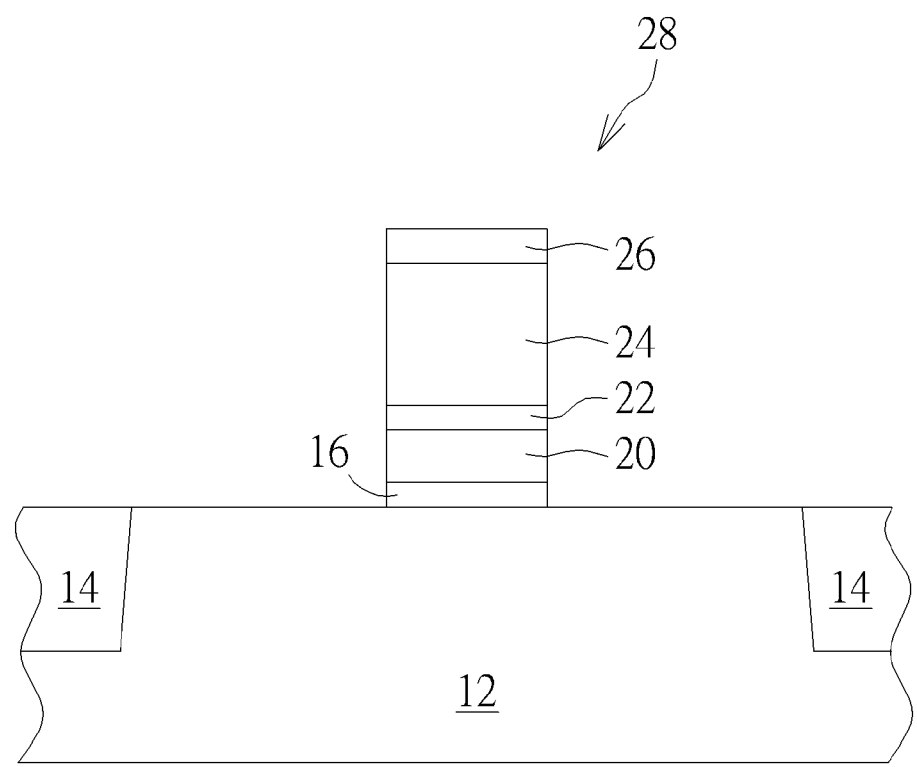

Next, as shown in FIG. 2, a patterned mask, such as a patterned resist (not shown) is formed on the hard mask 26, and a pattern transfer process is conducted by using the patterned resist as mask to partially remove the hard mask 26, silicon layer 24, BBM layer 22, and high-k dielectric layer 20 not covered by the patterned resist through single or multiple etching processes for forming a gate structure 28 on the interfacial layer 16. In other words, the gate structure 28 preferably composed of a patterned high-k dielectric layer 20, a patterned BBM layer 22, a patterned silicon layer 24, and a patterned hard mask 26.

Figure 3:
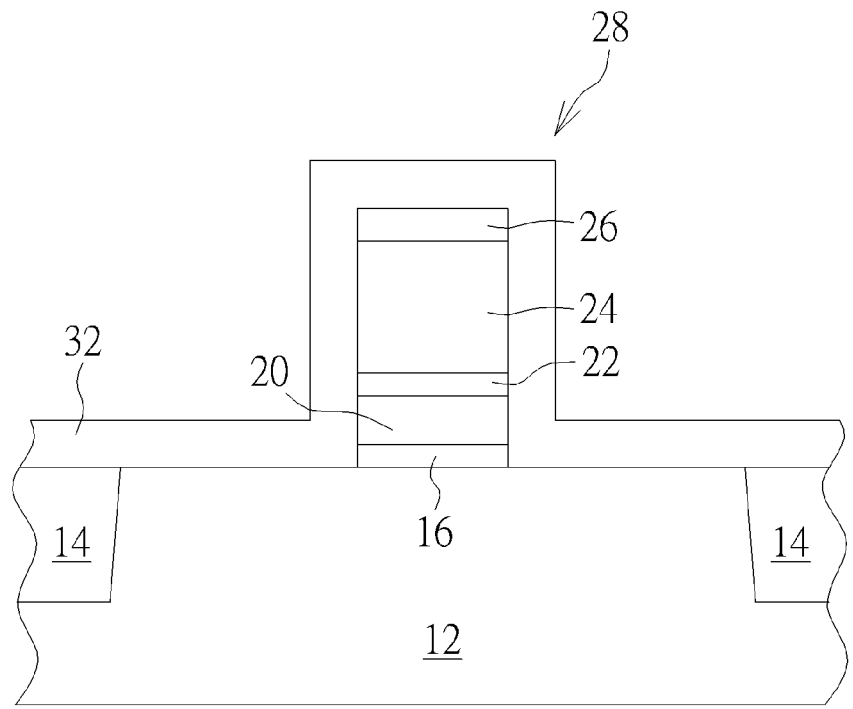
Figure 4:
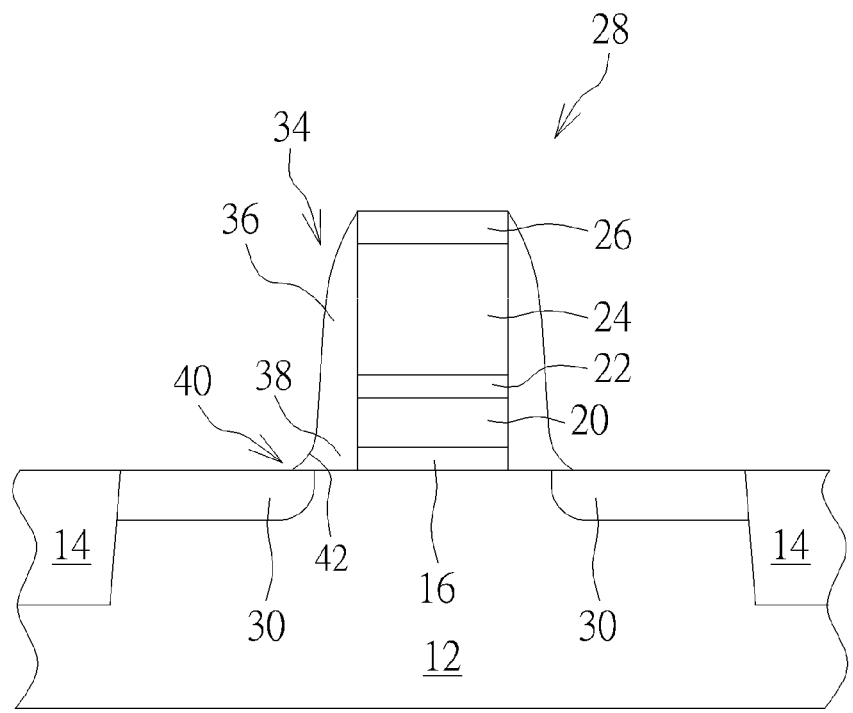

Next, as shown in FIG. 3, a spacer formation is conducted by first forming a liner 32 on the interfacial layer 16 and the gate structure 28, in which the liner 32 is preferably composed of silicon dioxide or silicon nitride, but not limited thereto. As shown in FIG. 4, an etching process is conducted thereafter to form a spacer 34 adjacent to the gate structure 28.

Typically, conventional approach for forming spacer is achieved by utilizing etching gas containing $CHF_3$, $CH_2F_2$, $O_2$, and $CH_3F$ accompanied by lower bias power to removing part of the liner for forming a sidewall spacer. Nevertheless, etching process conducted by using the aforementioned gas content often results in excessive lateral etching and damages the high-k dielectric layer or other material layer in the gate structure.

In order to resolve the aforementioned drawback brought out by conventional fabrication process, the present invention preferably conducts an etching process by using a gas containing $CH_3F$, $O_2$, and He through single or multiple etching to remove part of the liner 32 for forming a spacer 34. According to a preferred embodiment of the present invention, the bias power applied along with the gas containing $CH_3F$, $O_2$, and He during the etching process is preferably higher than the bias power applied with the conventional gas containing $CHF_3$, $CH_2F_2$, $O_2$, and $CH_3F$, and the spacer 34 formed by using this recipe preferably includes a middle portion 36 and a bottom portion 38, in which the width of the bottom portion 38 is wider than the width of the middle portion 36. In contrast to the conventional L-shaped spacer, entirely rectangular shaped spacer without any protruding portion, or spacer with concave shaped outer sidewall, the bottom portion 38 of the spacer 34 of the present invention, especially the portion away from the gate structure 28 on a horizontal level, preferably includes a tapered profile, in which the tapered profile 40 further includes a convex curve 42. More specifically, as shown in FIG. 4, despite the inner sidewall of the spacer 34 is aligned vertically against the gate structure 28, the outer sidewall of the spacer 34, especially the outer sidewall of the middle portion 36 reveals a concave curve while the outer sidewall of the bottom portion 38 reveals a convex curve, or the curve from the outer sidewall of the middle portion 36 and the curve from the outer sidewall of the bottom portion 38 are completely opposite to each other. Preferably, the protruding part of the bottom portion 38 could be used to increase the overall structural strength of the spacer 34 while protecting the high-k dielectric layer 20 within the gate structure 28 from the etching gas used during the spacer formation process. This completes the fabrication of a semiconductor device according to a preferred embodiment of the present invention.

Referring again to FIG. 4, which illustrates a semiconductor device structure according to an embodiment of the present invention. The semiconductor device preferably includes a substrate 12, an interfacial layer 16 on the substrate 12, a gate structure 28 on the interfacial layer 16, and a spacer 34 adjacent to the gate structure 28 and on part of the interfacial layer 16. As shown in the figure, the gate structure 28 includes a patterned high-k dielectric layer 20, a patterned BBM layer 22 on the high-k dielectric layer 20, a patterned silicon layer 24 on the patterned BBM layer 22, and a patterned hard mask 26 on the patterned silicon layer 24.

Preferably, the interfacial layer 16 is composed of silicon dioxide, the patterned BBM layer 22 is composed of TiN, the patterned silicon layer 24 is composed of polysilicon or amorphous silicon, and the spacer 34 is composed of silicon oxide or silicon nitride. The spacer 34 also includes a middle portion 36 and a bottom portion 38, in which the width of the bottom portion 38 is wider than the width of the middle portion 36. More specifically, the bottom of the spacer 34 includes a taper profile 40, in which the tapered profile 40 further includes a convex curve 42. When viewing from another angle, despite the inner sidewall of the spacer 34 is aligned vertically against the gate structure 28, the outer sidewall of the spacer 34, such as the outer sidewall of the middle portion 36 preferably reveals a concave curve while the inner sidewall of the outer sidewall of the bottom portion 38 reveals a convex curve, or the curve from the outer sidewall of the middle portion 36 and the curve from the outer sidewall of the bottom portion 38 are completely opposite to each other.

After forming the spacer 34, a light ion implantation process could be conducted to form a lightly doped drain (LDD) 30 in the substrate 12 adjacent to two sides of the spacer 34. The ions implanted during the light ion implantation process could be adjusted depending on the type of the transistor being fabricated. For instance, if a NMOS transistor were to be fabricated, n-type dopants could be implanted into the substrate where as if a PMOS transistor were to be fabricated, p-type dopants could be implanted into the substrate. It should be noted that despite the LDD 30 is formed in the substrate 12 after the fabrication of spacer 34 is completed, the LDD 30 could also be formed before the spacer 34 is fabricated, which is also within the scope of the present invention.

Figure 5:
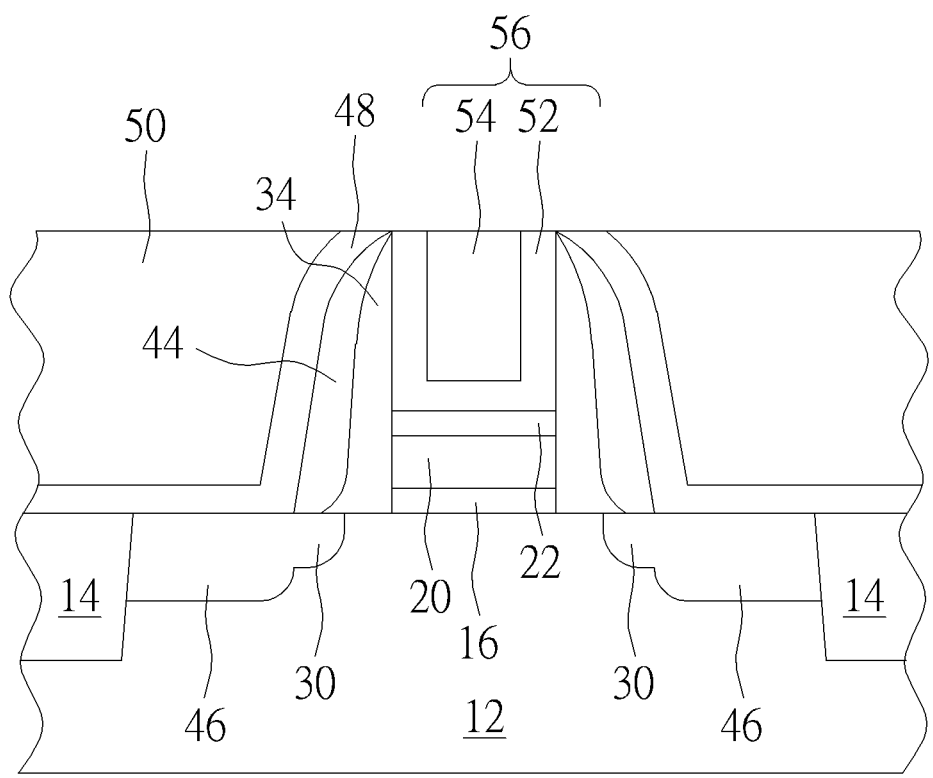

Next, as shown in FIG. 5, a main spacer 44 is formed on the sidewall of the spacer 34, and a source/drain region 46 is formed in the substrate 12 adjacent to two sides of the main spacer 44. According to an embodiment of the present invention, the formation of the main spacer 44 could be achieved by using the same approach utilized for forming the spacer 34. For instance, a liner could be deposited and then an etching gas containing $CH_3F$, $O_2$, and He is utilized to remove part of the liner for forming the main spacer 44. By following this approach, the bottom of the main spacer 44 would also reveal a similar tapered profile as in the spacer 34, in which the tapered profile also includes a convex curve.

Next, a contact etch stop layer (CESL) 48 could be formed on the gate structure 28, and an interlayer dielectric (ILD) layer 50 could be formed on the CESL 48. It should be noted that elements such as epitaxial layer and silicides could also be formed before the CESL 48, and as the formation of these elements are well known to those skilled in the art, the details of which are not explained herein for the sake of brevity.

Next, a replacement metal gate (RMG) process could be conducted to transform the gate structure 28 into a metal gate. The RMG process could be accomplished by first performing a selective dry etching or wet etching process, such as using etchants including ammonium hydroxide ($NH_4OH$) or tetramethylammonium hydroxide (TMAH) to remove the silicon layer 24 in the gate structure 28 for forming a recess (not shown). Next, a conductive layer 56 including a U-shaped work function metal layer 52 and low resistance metal layer 54 is deposited into the recess, and another planarizing process is conducted thereafter to form a metal gate.

In this embodiment, the work function metal layer 52 is formed for tuning the work function of the metal gate so that the device could be adapted in an NMOS or a PMOS transistor. For an NMOS transistor, the work function metal layer 52 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function metal layer 52 having a work function ranging between 4.8 eV and 5.2 eV may include titanium nitride (TiN), tantalum nitride (TaN), tantalum carbide (TaC), but is not limited thereto. A barrier layer (not shown) could be formed between the work function metal layer 52 and the low resistance metal layer 54, in which the material of the barrier layer may include titanium (Ti), titanium nitride (TiN), tantalum (Ta) or tantalum nitride (TaN). Furthermore, the material of the low resistance metal layer 54 may include copper (Cu), aluminum (Al), tungsten (W), titanium aluminum (TiAl), cobalt tungsten phosphide (CoWP) or any combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a gate structure on the substrate, wherein the gate structure comprises a patterned high-k dielectric layer, a patterned bottom barrier metal (BBM) layer on the patterned high-k dielectric layer, and a metal gate layer on the patterned BBM layer; and
a spacer adjacent to the gate structure, wherein the bottom of the spacer comprises a tapered profile and the tapered profile comprises a convex curve.

2. The semiconductor device of claim 1, further comprising an interfacial layer between the gate structure and the substrate.

3. The semiconductor device of claim 2, wherein the interfacial layer comprises silicon dioxide.

4. The semiconductor device of claim 1, wherein the patterned BBM layer comprises TiN.

5. The semiconductor device of claim 1, wherein the metal gate layer comprises a work function metal layer and a low resistance metal layer.

6. The semiconductor device of claim 5, wherein the work function metal layer comprises a work function between 3.9 eV and 4.3 eV.

7. The semiconductor device of claim 6, wherein the work function metal layer comprises TiAl, ZrAl, WAl, TaAl, HfAl, or TiAlC.

8. The semiconductor device of claim 5, wherein the work function metal layer comprises a work function between 4.8 eV and 5.2 eV.

9. The semiconductor device of claim 8, wherein the work function metal layer comprises TiN, TaN, or TaC.

10. The semiconductor device of claim 5, wherein the low resistance metal layer comprises Cu, Al, W, TiAl, or CoWP.

11. The semiconductor device of claim 1, wherein the spacer comprises a middle portion and a bottom portion, and the width of the bottom portion is greater than the width of the middle portion.

* * * * *